United States Patent [19]
Conrod et al.

[11] Patent Number: 5,376,248
[45] Date of Patent: Dec. 27, 1994

[54] DIRECT METALLIZATION PROCESS

[75] Inventors: Jay B. Conrod, Cheshire; Gary R. Sutcliffe, New Britain, both of Conn.

[73] Assignee: Enthone-OMI, Inc., West Haven, Conn.

[21] Appl. No.: 774,421

[22] Filed: Oct. 15, 1991

[51] Int. Cl.$^5$ .............................................. C25D 5/56
[52] U.S. Cl. ................................... 204/164; 204/125; 204/166
[58] Field of Search ................ 205/164, 166, 125; 427/304, 306, 322

[56] References Cited

U.S. PATENT DOCUMENTS

| | | | |
|---|---|---|---|
| 3,011,920 | 12/1961 | Shipley, Jr. | 106/1.11 |
| 3,099,608 | 7/1963 | Radovsky et al. | 205/123 |
| 3,692,502 | 9/1972 | Hangelar et al. | 205/169 X |
| 3,725,108 | 4/1973 | Sanbestre et al. | 205/169 X |
| 4,171,225 | 10/1979 | Molenaar et al. | 106/1.23 |
| 4,895,739 | 1/1990 | Bladon | 427/304 |
| 5,213,841 | 5/1993 | Gulla et al. | 427/98 |

OTHER PUBLICATIONS

F A Lowenheim, *Electroplating*, McGraw-Hill Book Co., New York, 1978, pp. 404–405, 418–423.

A. Molenaar et al, Autocatalytic Deposition of Tin, *J. Electrochem. Soc.*, vol. 136, No. 2, Feb. 1989, pp. 378–382.

*Primary Examiner*—John Niebling
*Assistant Examiner*—William T. Leader
*Attorney, Agent, or Firm*—DeLio & Peterson

[57] ABSTRACT

A direct metallization process is disclosed wherein plastic substrates may be electrolytically plated without the need for any prior electroless plating. The process uses a specially formulated post-activator composition at an elevated temperature to treat the activated substrate comprising either an alkaline solution containing an effective amount of metal ions which undergo a disproportionation reaction or an alkaline solution containing a metal ion such as $Cu^{+2}$.

12 Claims, No Drawings

DIRECT METALLIZATION PROCESS

BACKGROUND OF THE INVENTION

This invention relates to a method for the direct metal plating of nonconductive substrates and, in particular, to the electrolytic metallization of through-holes in printed circuit boards without the need for prior electroless chemical) metal plating of the holes.

The metal plating of plastics and other nonconductive (dielectric) substrates is well-known in the art and the following description will be directed for convenience to plastics, especially epoxy, and the preparation of printed circuit boards.

The preparation of printed circuit boards requires the plating of conductive metal layers, usually copper, onto the plastic substrate of the board. These boards vary in design and may have a copper layer on each surface of the epoxy (two-sided boards) or they can be multi-layer boards which have a plurality of inter-leaved parallel planar copper and epoxy layers. In both types, through-holes are drilled in the board and metal plated to facilitate connection between the circuits on the copper layers.

In general and for purposes of illustration, the electroless metal plating method for the manufacture of through-hole printed circuit boards is a sequence of steps commencing with a commercially available copper clad laminate or multi-laminate made from, e.g., paper-epoxy or glass-epoxy material. A predesigned series of through-holes is formed in the board in any conventional manner, then preferably treated to clean and condition the plastic for adhesion and activation of the metal plating. In one process the board is first contacted with a solvent to swell the epoxy and enhance the effect of the subsequent oxidative, e.g., permanganate, etching step. After etching, the board is water rinsed and then neutralized with a reductant to solubilize manganese residues by lowering their oxidation state. The reductant preferably contains an acid fluoride to dissolve glass fibers in the epoxy. The board is now ready for electroless metal plating using conventional procedures.

A preferred step before plating, if not done previously, is to dissolve some of the glass fibers in the epoxy using, for example, acid fluorides, and then to pretreat the board by cleaning and conditioning with a composition such as ENPLATE® PC-475 to remove hydrocarbon soils and oxides and to enhance the surface for activation. Thereafter the board is immersed in a catalyst, such as a tin-palladium solution, which activates the surface of the epoxy for electroless copper plating. ENPLATE Activator 444 sold by Enthone-OMI, Inc., West Haven Conn., is exemplary of this type catalyst. Following a water rinse, the laminate is immersed in an accelerator such as ENPLATE PA-491 to activate the catalyst by freeing the metal palladium ions on the board. After a water rinse, the board is dried and is immersed in an electroless copper plating solution for a period of time sufficient to plate copper to the desired thickness on the board surfaces and the through-hole connections. ENPLATE CU-700 and other similar plating compositions may be employed. The boards may then be electroplated using conventional techniques to provide a thicker final coating.

The above procedure, however, is time consuming and costly and it is preferred to improve the process by eliminating the need for electroless copper plating of the board prior to electrolytic plating. This process is generally known as direct metallization and in a commercial direct metallization process, after the drilling and cleaning steps, the board is conditioned using an adhesion promoter such as an alkaline permanganate solution, followed by treating with a cleaner conditioner to remove oxides and oils. Activation is a two-step procedure consisting of a pre-dip to prevent contamination of the activator by drag-in followed by contacting the board with a proprietary noble metal containing catalyst which is adsorbed onto the board. The catalyzed board is now specially treated with a proprietary accelerator to leave a highly conductive and catalytic surface and a final acid wash stabilizes the conductive film. The board may now be directly metal plated by electrolytic plating. The board may also be electrolessly plated although for most applications this step is not performed and the board directly electrolytically plated.

Previous industry attempts to provide a direct metallization process include the use of an ultra-high levelling electrolytic copper bath, and substrate coatings such as a conductive polymer, a carbon rich material and copper sulfide.

It is an object of the invention to provide an improved direct metallization process for plating plastics.

It is a further object of the invention to provide a method for increasing the conductivity of a nonconductive substrate to enable the substrate to be either electrolessly or electrolytically plated.

A further object is to provide a conductive substrate article of manufacture which may be either electrolessly or electrolytically plated and the resultant plated product.

Other objects and advantages will be apparent for the following description.

SUMMARY OF THE INVENTION

It has now been discovered that nonconductive substrates such as plastic may be made electrically conductive for metal plating thereon, e.g., electroless and/or electrolytic plating, by using a process comprising:

(1) contacting the substrate with a metal containing activator solution to activate (catalyze) the substrate surface for plating;
(2) treating the activated substrate with an alkaline post-activator solution comprising an effective amount of metal ions which undergo a disproportionation reaction during the treatment; and, preferably,
(3) treating the resulting substrate with an acid solution.

In a preferred embodiment, the activator solution is a tin-palladium catalyst solution well-known in the art as exemplified in U.S. Pat. Nos. 3,011,920; 3,532,518 and 3,672,938 which patents are hereby incorporated by reference. In another preferred embodiment as shown in U.S. Pat. No. 4,933,010 the activator solution is a concentrated HCl free activator which comprises stannous chloride, and palladium chloride colloidally dispersed in an aqueous solution of saturated sodium chloride.

The post-activator solution is preferably a composition containing stannous ions and an alkali or alkaline earth hydroxide. In another preferred embodiment, the post-activator is a composition comprising an alkali or alkaline earth metal hydroxide and a metal ion selected from, for example, copper (II), silver and bismuth.

DETAILED DESCRIPTION OF THE INVENTION

The process of the invention has been found to be particularly useful for treating epoxy resins although other suitable polymeric resins such as polyimide, ABS, polycarbonate and Noryl ® may also be employed.

The resin may contain glass fibers, paper, synthetic fibers, carbon black, alumina powders, silica powders, wax, etc. as fillers, pigments, mold release agents, reinforcing agents, etc.

After the resin has been conditioned as noted hereinabove and is ready for activation, it is preferred that a pre-dip be used to prevent drag-in from the prior baths. Generally, the composition of the pre-dip contains anions common to the activator solution and in about the same proportion. For example, if a palladium chloride-stannous chloride-sodium chloride activator is used, the pre-dip will contain predominantly sodium chloride in an amount about the same as in the activator solution. In a conventional electroless metal plating process a composition such as ENPLATE PC-236 is generally employed for this purpose.

Any suitable catalytic metal, e.g., a noble metal, containing activator solution may be employed in the process of the invention. Generally, the activator is the well-known stabilized reaction product of stannous chloride and palladium chloride which is sold dry or as a concentrated solution in HCl. The older two-step process consisted of separate HCl solutions of stannous chloride and palladium chloride and may be employed but is not preferred because it is not economical for most uses. Other precious metals may be used but are generally not cost effective. Exemplary activator compositions are shown in U.S. Pat. Nos. 3,011,920; 3,532,518 and 3,672,938. In general, a commercial activator composition contains 0.1–1 g/l $PdCl_2$, 20–50 g/l $SnCl_2$ and 15–50 g/l HCl.

A preferred activator type composition is disclosed in U.S. Pat. No. 4,933,010, which patent is hereby incorporated by reference. In this patent, a concentrated HCl free activator for chemical plating is shown which contains stannous chloride, and palladium chloride colloidally dispersed in an aqueous solution of saturated sodium chloride. Preferably the activator includes 5 to 10 g/l of stannous chloride, 0.1 to 0.2 g/l of palladium chloride, 0.05–10 volume/volume percent of sulfuric acid, and 50–280 g/l of sodium chloride, and optionally, 0.015–0.03 g/l vanillin.

Another preferred activator because of its demonstrated effectiveness is termed ENPLATE DPS 9368 by Enthone-OMI, Inc., and contains palladium chloride, stannous chloride, HCl and resorcinol. A composition comprising 9% by volume DPS 9368, 290 g/l NaCl, 5 ml/l HCl 37% has been found to provide excellent results.

While any suitable catalytic metal containing activator solution may be employed, it is an important feature of the invention that the activated resin be treated at an effective temperature for a suitable time with a specially formulated post-activator solution in order to obtain the surface conductivity on the resin needed to electrolessly or electrolytically plate the resin.

Post-activation (also known as acceleration) of activated resins for electroless plating is well-known in the art and it is generally accepted that this step modifies the surface layer of the palladium nuclei, and stannous and stannic hydrous oxides and oxychlorides. Any acid or alkaline solutions in which excess tin is appreciably soluble and catalytic palladium nuclei become exposed have been employed in the prior art. In general, a resin activated with a commercial palladium-tin-HCl solution may be post-activated with dilute sulfuric acid (10% by volume) by immersion for about 5 minutes at room temperature.

While the above-conventional procedures have been acceptable to prepare the resin for electroless plating, it has been found that a specially formulated post-activator solution be employed to provide the resin surface with the conductivity (measured as resistivity) needed to be electrolytically plated or even electrolessly plated for some difficult to plate situations, e.g., a no flash additive process. In general, it is important that the resistivity of the resin surface be less than about 250 ohms, preferably less than about 100 ohms and most preferably less than about 20 ohms or even 10 ohms. The resistivity is measured by side to side contact of a printed circuit board with conductivity meter pins. Using the conventional steps for electroless plating as noted above, the resistivities obtained are typically above about 1000 ohms.

Broadly stated, the post-activator solution is an alkaline solution having a pH greater than about 12 usually greater than 13, e.g., 14, and comprises an effective amount of metal ions which undergo a disproportionation reaction during the treatment. Preferred compositions are disclosed in an article entitled "Autocatalytic Deposition of Tin" by A. Molenaar and J. W. G. de Bakker, J. Electrochem. Soc., Vol. 136, No. 2, February 1989, pages 378–382.

With regard to the metal being tin and the alkaline material being an alkali or alkaline earth metal hydroxide, it is preferred that the molar ratio of the hydroxide to tin (II) be greater than about 1, preferably about 3 to 9. In general, the metal, e.g., $SnCl_2$, is in an amount of about 0.1 g/l to saturation, preferably 30 g/l—saturation and most preferably 50–120 g/l and the hydroxide, in the sodium form, is about 40–360 g/l or higher, preferably about 80–120 g/l. A preferred composition contains 0.5M $SnCl_2$, 2.5M NaOH and 0.66M potassium sodium tartrate. Any suitable chelating agent may be used and is usually present in a molar amount needed to chelate the metal ions.

While $SnCl_2$ is the metal salt most preferred, it will be appreciated by those skilled in the art that other disproportionable metals such as Pb(II), Pt(II), Pd(II), Hg (I), In(I), Cu(I), TI(I) and Au(I) may be employed. Other suitable chelating agents may also be employed, e.g., sodium citrate, EDTA, etc.

In another preferred embodiment, the post-activator solution comprises an alkali or alkaline earth metal hydroxide in an amount needed to provide a pH greater than about 13, e.g., 14, and is generally present in an amount up to about 10M or higher, preferably 2.5 to 5.5M and a metal ion selected from copper II, silver and bismuth in an amount of up to about 500 ppm or higher, preferably 50 or 100 to 200 ppm.

To practice the method of the invention the activated plastic substrate is contacted with the post-activator composition at an elevated temperature for a time sufficient to render the surface sufficiently conductive for electrolytic plating. Contacting procedures may vary widely and satisfactory results for epoxy resin are provided by immersing the part in the activator solution for 5 to 15 minutes at 35° to 50° C. or higher. Contacting of the resin in the post-activator solution is also about 5 to 15 minutes, preferably 8 to 12 minutes, at 65° to 90° C. or higher, preferably 73° to 85° C. The times and temperatures may be longer and/or lower or higher than noted above and will vary depending on the substrate being treated and the compositions of the solutions as will be appreciated by those skilled in the art. Other means such as spraying, dipping or flooding may be used for activating and/or post-activating the plastic part.

The substrate is now preferably contacted with an acid solution to, it is hypothesized, stabilize the post-activated surface. A 10% by volume sulfuric acid solution used at room temperature for up to about 3 minutes has been found to provide excellent results and a level of up to about 20% by volume or higher may be employed. Other suitable acids may also be employed such as HCl, acetic, etc.

The substrate may now be metal plated using conventional electroless or electrolytic baths such as ENPLATE CU-944 and Cubat® products such as XR 235A and XR 235B sold by Enthone-OMI. Before plating however, the board may be further processed using standard techniques to image the boards using, for example, conventional primary image resists. It is also preferred to microetch the board to improve copper to copper adhesion using a material such as ENPLATE AD-485, which contains sulfuric acid.

The present invention will now be described in detail by reference to the following examples.

EXAMPLE 1

A two-sided copper clad epoxy-glass FR-4 laminate board containing through-holes which was deburred using a pumice scrub and conditioned using a monoethanolamine and triethanolamine containing commercial solution 1175A was metallized using the following procedure:

(a) pre-dip in an aqueous solution containing 270 g/l NaCl and 5 ml/l HCl (37%) at room temperature for 1 minute;
(b) cold water rinse for 1 minute;
(c) activate by immersion in a solution containing, in g/l, 0.72 $PdCl_2$, 45 $SnCl_2$, 46 HCl (37%), 4.5 resorcinol, 290 NaCl for 10 minutes at 45° C.;
(d) cold water rinse for 1 minute;
(e) post-activate using a solution containing 94.8 g/l $SnCl_2$, 100 g/l NaOH, 138.7 g/l potassium sodium tartrate at 27° C. for 10 minutes;
(f) cold water rinse for 1 minute;
(g) wash using 10% by volume $H_2SO_4$ for 1 minute; and
(h) cold water rinse for 1 minute.

The above boards were tested for conductivity (resistivity) by side to side measurement using a Fluke 8842A Multimeter and measured <10 ohms. After measurement, the board was microetched using ENPLATE AD-485 and electroplated at 25 amps/ft$^2$ to 1 mil using ENPLATE CU-944. A commercially acceptable through-hole plated board was obtained.

EXAMPLE 2

EXAMPLE 1 was repeated except that the post-activator was a solution containing 5M NaOH and 100 ppm $Cu^{+2}$ ions. The resistivity of the board was 7 ohms and excellent electrolytic plating was obtained. When the solution did not contain the copper ions, the resistivity was about 1000 ohms and the board could not be satisfactorily plated.

EXAMPLE 3

EXAMPLE 1 was repeated using a commercial $PdCl_2$—$Sn_2Cl_2$—HCl composition (ENPLATE Activator 444) as the activator. The resistivity of the board was 10 ohms and excellent electrolytic plating was obtained.

We claim:

1. A method for making a plastic substrate electrically conductive and electrolytically metal plating thereon comprising:
   (1) contacting the substrate with a noble metal-containing electroless metal plating activator solution to activate the substrate;
   (2) treating the activated substrate at a temperature above about 65° C. with an alkaline post-activator solution having a pH greater than about 12 and which is substantially free of a reducing agent, said solution comprising an effective amount of metal ions which undergo a disproportionation reaction during the treatment, said treatment providing a substrate resistivity of less than about 250 ohms; and
   (3) electrolytically metal plating the substrate.

2. The method of claim 1 having the additional step of treating the post-activated substrate with an acid solution.

3. The method of claim 2 wherein the activator solution contains palladium and tin and the post-activator solution contains $Sn^{+2}$ as the metal ion.

4. The method of claim 3 wherein the post-activator solution contains about 0.1 g/l to saturation $SnCl_2$ and 30 g/l to saturation NaOH.

5. The method of claim 4 wherein the molar ratio of NaOH to $SnCl_2$ is greater than about 1.

6. The method of claim 5 wherein the post-activator solution also contains a chelating agent.

7. A method for making a plastic substrate electrically conductive and electrolytically metal plating thereon comprising:
   (1) contacting the substrate with a noble metal-containing electroless metal plating activator solution to activate the substrate;
   (2) treating the activated substrate at a temperature above about 65° C. with a post-activator solution having a pH greater than about 13 and which is substantially free of a reducing agent, said solution comprising a metal ion selected from the group selected from Cu(II), Ag and Bi, said treatment providing a substrate resistivity of less than about 250 ohms; and
   (3) electrolytically metal plating the substrate.

8. The method of claim 7 having the additional step of treating the post-activated substrate with an acid solution.

9. The method of claim 8 wherein the activator solution contains palladium and tin.

10. The method of claim 9 wherein the post-activator solution contains an alkali or alkaline earth metal hydroxide in an amount up to about 10M and the metal ion in an amount up to about 500 ppm.

11. The method of claim 10 wherein the metal ion is Cu (II).

12. A method for making a plastic substrate electrically conductive and electrolytically metal plating thereon comprising:

(1) contacting the substrate with a noble metal-containing electroless metal plating activator solution to activate the substrate;

(2) treating the activated substrate at a temperature above about 65° C. with an alkaline post-activator solution which is substantially free of a reducing agent and which is selected from the group consisting of (1) solutions having a pH greater than about 12 comprising an effective amount of metal ions which undergo a disproportionation reaction during the treatment and (2) solutions having a pH treatment providing a substrate resistivity of less than about 250 ohms; and greater than about 13 comprising a metal ion selected from the group consisting of Cu(II), Ag and Bi, said treatment providing a substrate resistivity of less than about 250 ohms; and (3) electrolytically metal plating the substrate.

* * * * *

UNITED STATES PATENT AND TRADEMARK OFFICE
CERTIFICATE OF CORRECTION

PATENT NO. : 5,376,248
DATED      : December 27, 1994
INVENTOR(S) : Conrod et al.

It is certified that error appears in the above-identified patent and that said Letters Patent is hereby corrected as shown below:

Column 1, line 9:  insert - -(- - before "chemical".

Column 5, line 22:  "Cubat" should read - -Cubath- -.

Column 8, lines 2-3:  delete "treatment providing a substrate resistivity of less than about 250 ohms; and".

Signed and Sealed this

Twenty-eight Day of February, 1995

Attest:

BRUCE LEHMAN

Attesting Officer    Commissioner of Patents and Trademarks